(12) United States Patent
van der Straten et al.

(10) Patent No.: US 12,317,752 B2
(45) Date of Patent: May 27, 2025

(54) MRAM STRUCTURE WITH MULTILAYER ENCAPSULATION

(71) Applicant: INTERNATIONAL BUSINESS MACHINES CORPORATION, Armonk, NY (US)

(72) Inventors: Oscar van der Straten, Guilderland Center, NY (US); Koichi Motoyama, Clifton Park, NY (US); Joseph F. Maniscalco, Lake Katrine, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 694 days.

(21) Appl. No.: 17/302,766

(22) Filed: May 12, 2021

(65) Prior Publication Data

US 2022/0367788 A1 Nov. 17, 2022

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
See application file for complete search history.

(56) References Cited

U.S. PATENT DOCUMENTS

| 8,772,888 | B2 | 7/2014 | Jung | |
| 9,306,158 | B2 | 4/2016 | Tsai | |
| 9,553,257 | B1 | 1/2017 | Annunziata | |
| 10,483,460 | B2 | 11/2019 | Nagel | |
| 10,516,100 | B2* | 12/2019 | Sundar | H10B 61/00 |
| 10,770,654 | B2 | 9/2020 | Yang | |
| 11,145,809 | B2* | 10/2021 | Yang | H10N 50/80 |
| 11,217,744 | B2* | 1/2022 | Chern | H10B 61/22 |
| 12,219,879 | B2* | 2/2025 | Peng | H10N 50/01 |
| 2011/0049655 | A1 | 3/2011 | Assefa | |
| 2016/0225981 | A1* | 8/2016 | Deshpande | H10N 50/01 |
| 2017/0125663 | A1* | 5/2017 | Nagel | G11C 11/161 |
| 2018/0166625 | A1* | 6/2018 | Kuo | H10N 50/80 |

* cited by examiner

*Primary Examiner* — Fernando L Toledo
*Assistant Examiner* — Jahae Kim
(74) *Attorney, Agent, or Firm* — L. Jeffrey Kelly

(57) ABSTRACT

A semiconductor structure may include a pyramidal magnetic tunnel junction on top of a bottom electrode, a tunnel layer on top and in electrical contact with the first magnetic layer, a second magnetic layer on top and in electrical contact with the tunnel layer, and a hard mask cap on top of the second magnetic layer. The pyramidal magnetic tunnel junction may have a first magnetic layer on top and in electrical contact with the bottom electrode. The semiconductor structure may include a first encapsulation spacer positioned along vertical sidewalls of the hard mask cap, a second encapsulation spacer positioned along vertical sidewalls of the second magnetic layer, a third encapsulation spacer positioned along vertical sidewalls of the tunnel layer, and a fourth encapsulation spacer positioned along vertical sidewalls of the first magnetic layer.

24 Claims, 10 Drawing Sheets

MRAM STRUCTURE WITH MULTILAYER ENCAPSULATION

BACKGROUND

The present invention relates generally to a semiconductor structure and a method of forming the same. More particularly, the present invention relates to a magneto-resistive random-access memory (MRAM) structure with multilayer encapsulation.

MRAM is a non-volatile computer memory technology. MRAM data is stored by magnetic storage elements. The elements are formed from two ferromagnetic layers, each of which can hold a magnetic field, separated by a thin insulating layer. One of the two layers is a reference magnet or a reference layer set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit.

SUMMARY

According to one embodiment of the present invention, a semiconductor structure is provided. The semiconductor structure may include a pyramidal magnetic tunnel junction on top of a bottom electrode, a tunnel layer on top and in electrical contact with the first magnetic layer, a second magnetic layer on top and in electrical contact with the tunnel layer, and a hard mask cap on top of the second magnetic layer. The pyramidal magnetic tunnel junction may have a first magnetic layer on top and in electrical contact with the bottom electrode. The semiconductor structure may include a first encapsulation spacer positioned along vertical sidewalls of the hard mask cap, a second encapsulation spacer positioned along vertical sidewalls of the second magnetic layer, a third encapsulation spacer positioned along vertical sidewalls of the tunnel layer, and a fourth encapsulation spacer positioned along vertical sidewalls of the first magnetic layer. A top surface of the second encapsulation spacer may be substantially flush with a top surface of the hard mask cap, a top surface of the third encapsulation spacer may be substantially flush with the top surface of the hard mask cap, and a top surface of the fourth encapsulation spacer may be substantially flush with the top surface of the hard mask cap. The semiconductor structure may include a first metal interconnect below and in electrical contact with the bottom electrode and a second metal interconnect above and in electrical contact with the hard mask cap. The first magnetic layer may have a wider diameter than the tunnel layer and the tunnel layer may have a wider diameter than the second magnetic layer. The first encapsulation spacer and the second encapsulation spacer may be made of silicon nitride of different nitrogen concentrations. The first encapsulation spacer may have a higher concentration of nitrogen than the second encapsulation spacer. The third encapsulation spacer and the fourth encapsulation spacer may be made of an oxide material. The first encapsulation spacer, the second encapsulation spacer, the third encapsulation spacer and the fourth encapsulation spacer may be made of same material.

According to another embodiment of the present invention, a semiconductor structure is provided. The semiconductor structure may include a magnetic tunnel junction. The magnetic tunnel junction may have a first magnetic layer and a second magnetic layer separated by a tunnel layer. The tunnel layer may be on top and in electrical contact with the first magnetic layer. The magnetic tunnel junction may have a hard mask cap on top and in electrical contact with the second magnetic layer. The semiconductor structure may include a first encapsulation spacer positioned along vertical sidewalls of the hard mask cap, a second encapsulation spacer positioned along vertical sidewalls of the second magnetic layer, a third encapsulation spacer positioned along vertical sidewalls of the tunnel layer, and a fourth encapsulation spacer positioned along vertical sidewalls of the first magnetic layer. A top surface of the second encapsulation spacer may be substantially flush with a top surface of the hard mask cap, a top surface of the third encapsulation spacer may be substantially flush with the top surface of the hard mask cap, and a top surface of the fourth encapsulation spacer may be substantially flush with the top surface of the hard mask cap. The semiconductor structure may include a first metal interconnect below and in electrical contact with the magnetic tunnel junction and a second metal interconnect above and in electrical contact with the hard mask cap. The first magnetic layer may have a wider diameter than the tunnel layer, the tunnel layer may have a wider diameter than the second magnetic layer. The first encapsulation spacer and the second encapsulation spacer may be made of silicon nitride of different nitrogen concentrations. The first encapsulation spacer may have a higher concentration of nitrogen than the second encapsulation spacer. The third encapsulation spacer and the fourth encapsulation spacer may be made of an oxide material. The first encapsulation spacer, the second encapsulation spacer, the third encapsulation spacer and the fourth encapsulation spacer may be made of same material.

According to another embodiment of the present invention, a method is provided. The method may include forming a magnetic tunnel junction. The magnetic tunnel junction may have a first magnetic layer and a second magnetic layer separated by a tunnel layer. The tunnel layer may be on top and in electrical contact with the first magnetic layer, the magnetic tunnel junction may have a hard mask cap on top and in electrical contact with the second magnetic layer. The method may include forming a first encapsulation spacer positioned along vertical sidewalls of the hard mask cap, forming a second encapsulation spacer positioned along vertical sidewalls of the second magnetic layer, forming a third encapsulation spacer positioned along vertical sidewalls of the tunnel layer, and forming a fourth encapsulation spacer positioned along vertical sidewalls of the first magnetic layer. A top surface of the second encapsulation spacer may be substantially flush with a top surface of the hard mask cap, a top surface of the third encapsulation spacer is substantially flush with the top surface of the hard mask cap, and a top surface of the fourth encapsulation spacer is substantially flush with the top surface of the hard mask cap. The method may include forming a first metal interconnect below and in electrical contact with the magnetic tunnel junction and forming a second metal interconnect above and in electrical contact with the hard mask cap. The first magnetic layer may have a wider diameter than the tunnel layer. The tunnel layer may have a wider diameter than the second magnetic layer. The first encapsulation spacer and the second encapsulation spacer may be made of silicon nitride of different nitrogen concentrations. The first encapsulation spacer may have a higher concentration of nitrogen than the second encapsulation spacer. The third encapsulation spacer and the fourth encapsulation spacer may be made of an oxide material. The first encapsulation spacer, the second encapsulation spacer, the third encapsulation spacer, and the fourth encapsulation spacer may be made of same material.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
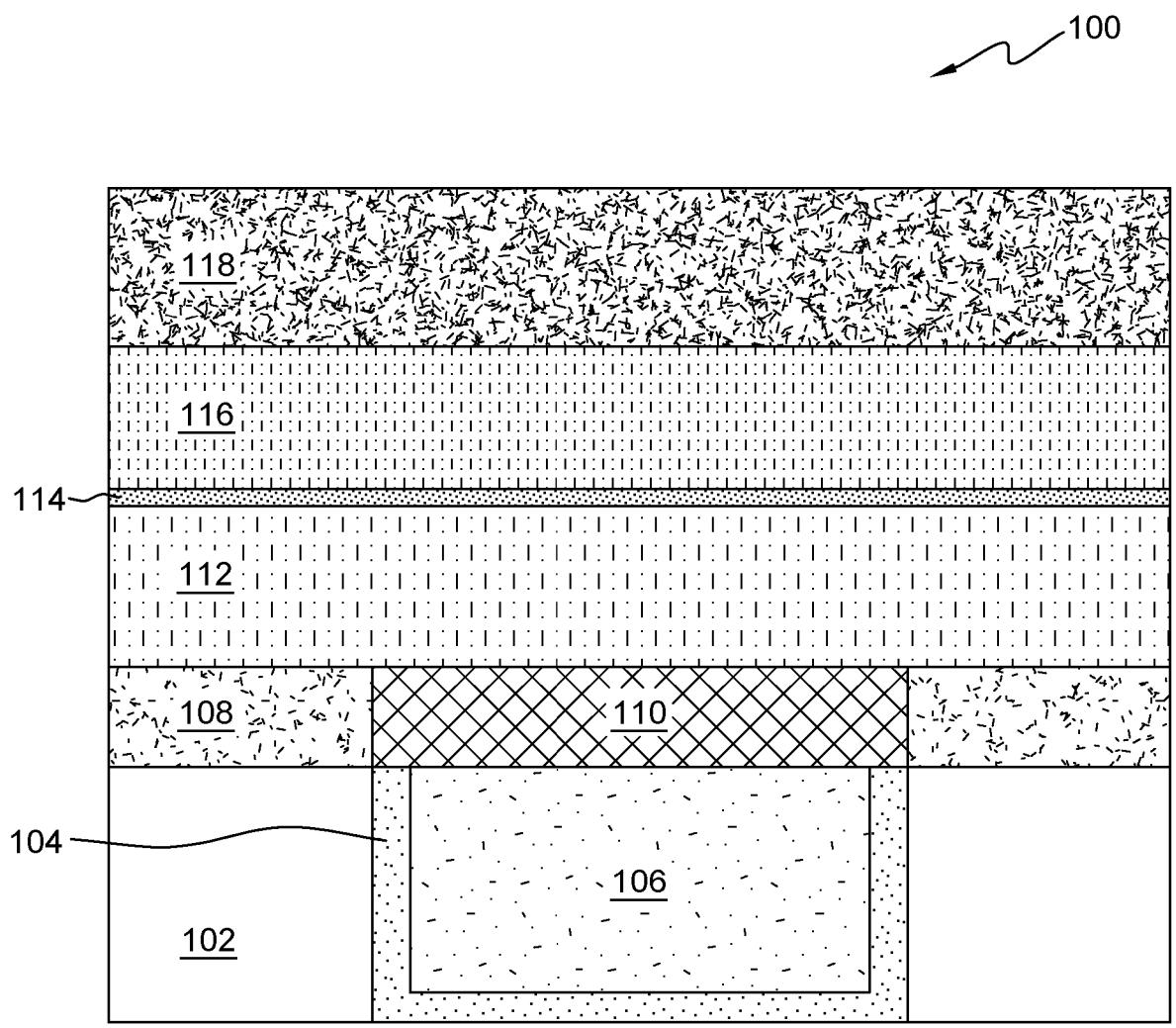
FIG. 1 is a cross section view illustrating a structure post MTJ stack and hard mask deposition according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM is a non-volatile random-access memory technology. Data in the MRAM is not stored as electric charge or current flows, but by magnetic storage elements. A typical MRAM structure includes a pillar shaped MTJ stack that is formed from blanket MTJ stack using a one-step patterning process. The MTJ stack may include a first magnetic layer, also known as the reference layer, and a second magnetic layer, also known as the free layer, separated by a tunnel layer. Each of the magnetic layers may hold a magnetization. In some MRAMs, one of the two magnetic layers may be a permanent magnet set to a particular polarity, while the other magnetic layer may be variable, so that it can be changed to match that of an external electromagnetic field to store memory.

High performance MRAM structures, or devices, may require well-defined interfaces between the sidewalls of the MTJ stack and the surround layers. It is especially important to have a well-defined interface around the free layer because the free layer is sensitive to variations which may short the MRAM structure. Conventional fabrication technique of the MTJ stack occurs in one step. That is, a subtractive patterning step may be performed to pattern the MTJ stack. During the subtractive patterning step, metal atoms from the reference layer may re-sputter onto the sidewalls of the tunnel layer and the free layer that is being patterned. The re-sputtered metal atoms may have an adverse effect on the functionality of the free layer and the tunnel layer, and the re-sputtered metal atoms prevent the free layer from forming a well-defined interface with the surrounding layer. As a result of the re-sputtering, the free layer performance may be adversely impacted and the tunnel layer may cause shorts within the structure, making the MRAM structure unusable. Therefore, there exists a need to form the MTJ stack within the MRAM structure such that the MTJ stack includes well-defined interfaces while eliminating the possibility of metal re-sputtering.

The present disclosure presents a method and structures to address the above described problem. More particularly, embodiments of the present invention relate to a MRAM structure that includes one or more encapsulation sidewalls. The MRAM structure includes a pyramid shaped MTJ stack that is encapsulated, or surrounded, by one or more encapsulation sidewalls. The method describes patterning the pyramid shaped MTJ stack in multiple steps in order to eliminate the possibility of metal re-sputtering.

FIGS. 1-10 illustrate a method of making the MRAM structure that includes the pyramid shaped MTJ stack that is encapsulated by one or more encapsulation sidewalls.

Referring now to FIG. 1, a MRAM structure 100 post MTJ stack and hard mask deposition is shown, in accordance with an embodiment. The structure 100 may include an interlayer dielectric (ILD) 102, a barrier layer 104 surrounding a first metal interconnect 106, a bottom electrode 110 surrounded by a dielectric cap layer 108, a first and a second magnetic layer 112, 116 separated by a tunnel layer 114, and a hard mask 118.

The ILD 102 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 102 may also be referred to as the first ILD. The first metal interconnect 106 is formed within the ILD 102, using known techniques. The first metal interconnect 106 may be made of metal such as copper or tungsten. The first metal interconnect 106 is surrounded by the barrier layer 104. The barrier layer 104 separates the first metal interconnect 106 from the ILD 102. The barrier layer 104 may be made of tantalum, tantalum nitride, titanium, or titanium nitride. The barrier layer 104 may also be referred to as the first barrier layer.

The dielectric cap layer 108 is deposited on top of the ILD 102 and the first metal interconnect 106, using known deposition techniques. The dielectric cap layer 108 may be made of substantially the same material as the ILD 102, or a different material including silicon nitride (SiN), or silicon carbon nitride (SiCN). The bottom electrode 110 is then formed within a via (not shown) in the dielectric cap layer 108. Once the via is formed, the via is filled with a conductive material, such as, for example, copper, tungsten, cobalt, titanium, tantalum, aluminum or alloys thereof (such as TiAl, TaAl), forming the bottom electrode 110. A planarization process, such as, for example, chemical mechanical polishing (CMP), may be done to remove excess material from a top surface of the structure 100.

After the formation of the bottom electrode 110, the first magnetic layer 112 is deposited, using known deposition techniques, on the top surface of the structure 100 followed by the deposition of the tunnel layer 114, the second magnetic layer 116, and the hard mask 118. The first magnetic layer 112 may be referred to as the reference layer and the second magnetic layer 116 may be referred to as the free layer. The first magnetic layer 112 is separated from the second magnetic layer 116 by the tunnel layer 114. The tunnel layer 114 should be sufficiently thin to allow for electrons to tunnel from one magnetic layer, for example the first magnetic layer 112, to another magnetic layer, for example the second magnetic layer 116. The tunnel layer 114 may include any suitable insulator material in accordance with the embodiments described herein. Examples of suitable insulator materials include, but are not limited to, magnesium oxide (MgO) and aluminum oxide ($Al_2O_3$). The hard mask 118 is deposited on top of the second magnetic layer 116 utilizing a conventional deposition process such as, for example, chemical vapor deposition (CVD), plasma enhanced chemical vapor deposition (PECVD), physical vapor deposition (PVD), or atomic layer deposition (ALD). The hard mask 118 may be made of titanium nitride, titanium, or tantalum. The top of the hard mask 118 may also include any dielectric material such as, for example, silicon dioxide, silicon nitride and/or silicon oxynitride prior to hard mask patterning.

Figure 2:
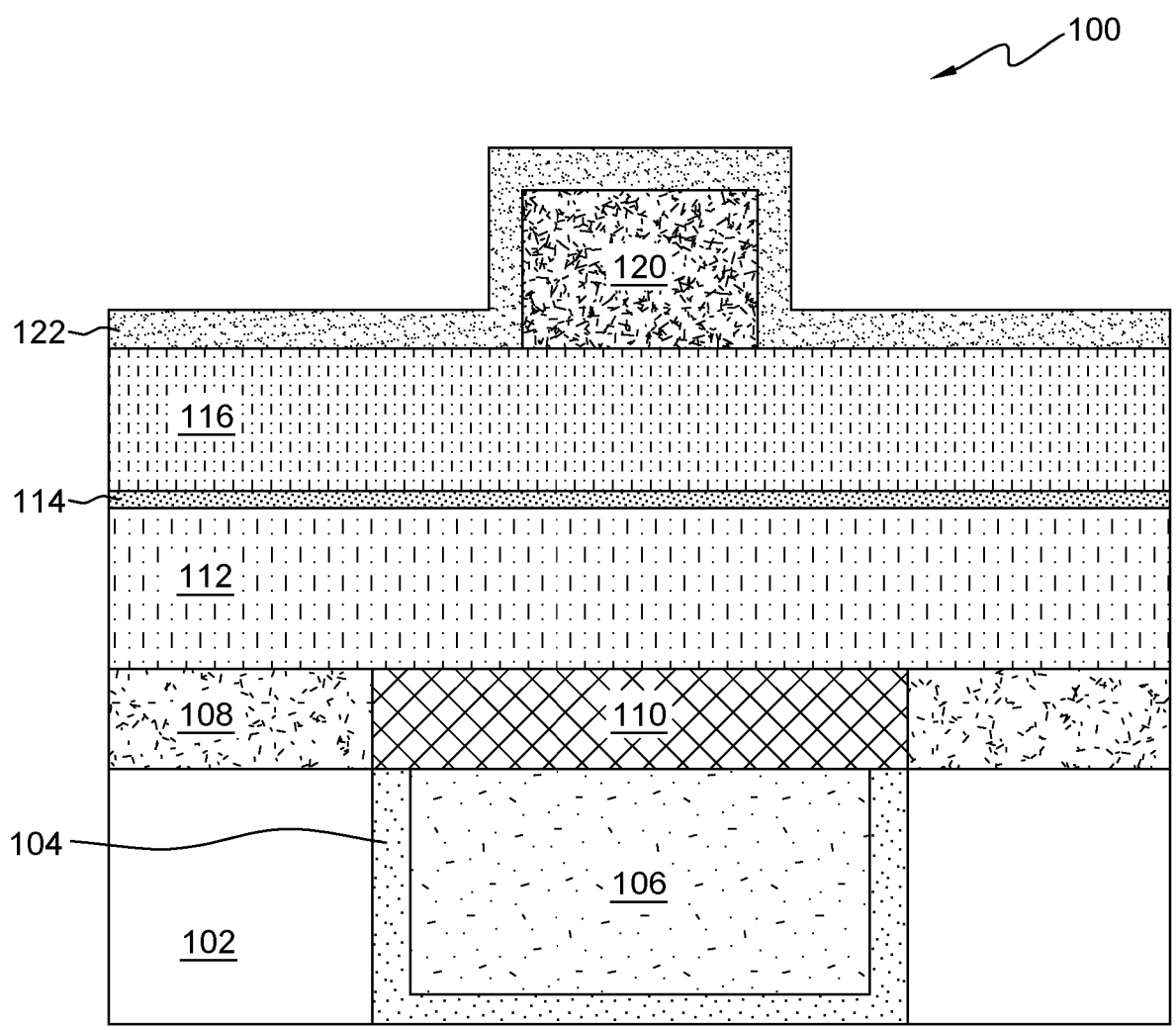
FIG. 2 is a cross section view illustrating a hard mask cap and a first encapsulation layer formed on top of the structure according to an exemplary embodiment.

Referring now to FIG. 2, the structure 100 with a hard mask cap 120 and a first encapsulation layer 122 is shown, in accordance with an embodiment. The structure 100 first undergoes the step of patterning the hard mask 118 to form the hard mask cap 120. The first encapsulation layer 122 is then conformally deposited, using known deposition techniques such as, for example, ALD, on top of the structure 100. The first encapsulation layer 112 may be made of silicon nitride ($SiN_x$).

Figure 3:
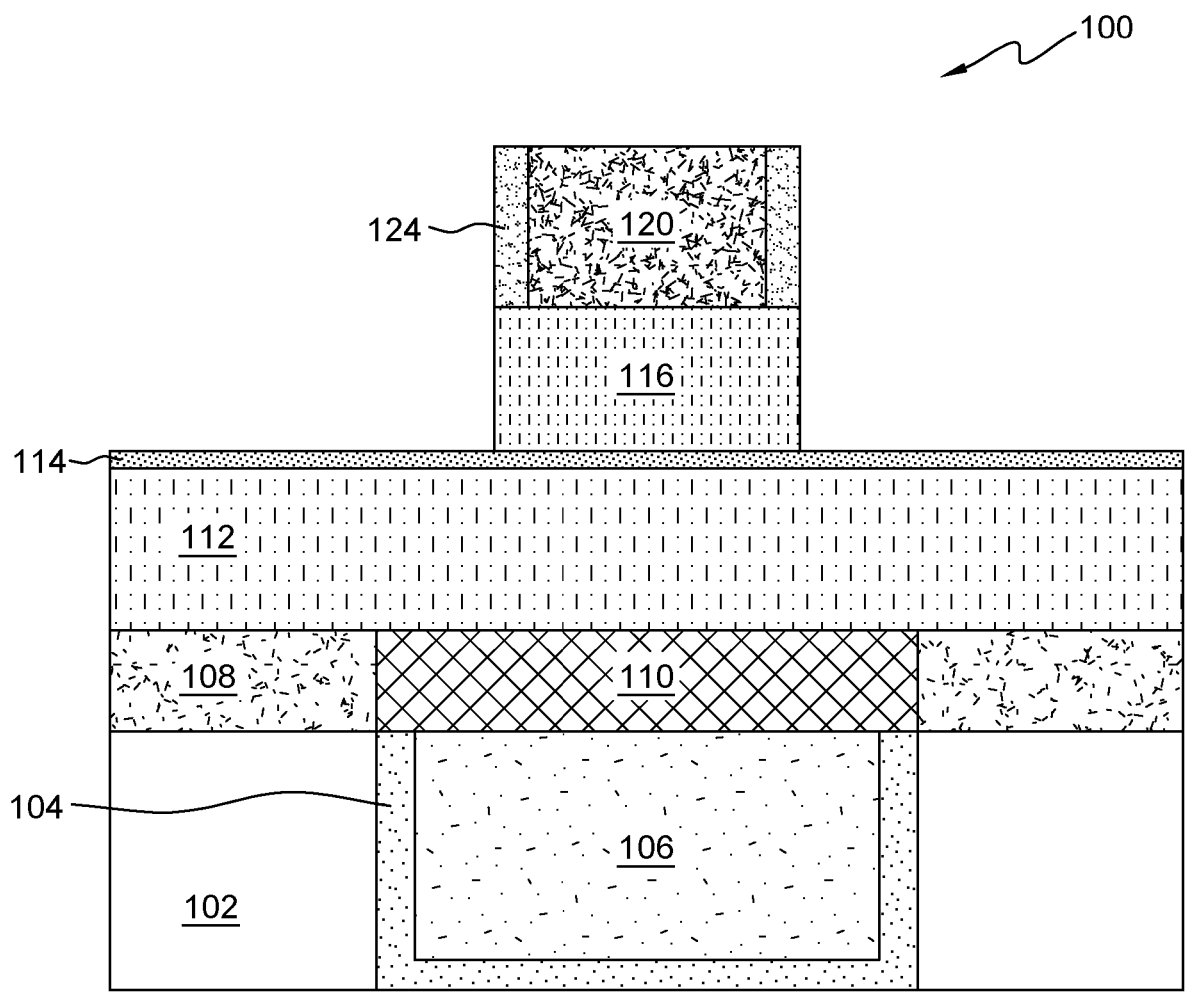
FIG. 3 is a cross section view illustrating a first encapsulation spacer formed at the sidewalls of the hard mask cap according to an exemplary embodiment.

Referring now to FIG. 3, the structure 100 with a first encapsulation spacer 124 is shown, in accordance with an embodiment. The structure 100 undergoes an etch process, such as, for example, reactive ion etch (ME), to remove the first encapsulation layer 122 from horizontal portions of the structure 100 thereby forming the first encapsulation spacer 124. The first encapsulation spacer 124 is formed at the sidewalls of the hard mask cap 120, and vertically extends from a top surface of the hard mask cap 120 to a top surface of the second magnetic layer 116. The structure 100 then undergoes an additional patterning process during which the second magnetic layer 116 is patterned, exposing a top surface of the tunnel layer 114. The second magnetic layer 116 remains below the hard mask cap 120 and the first encapsulation spacer 124 such that sidewalls of the second magnetic layer 116 are substantially flush with the sidewalls of the first encapsulation spacer 124.

Figure 4:
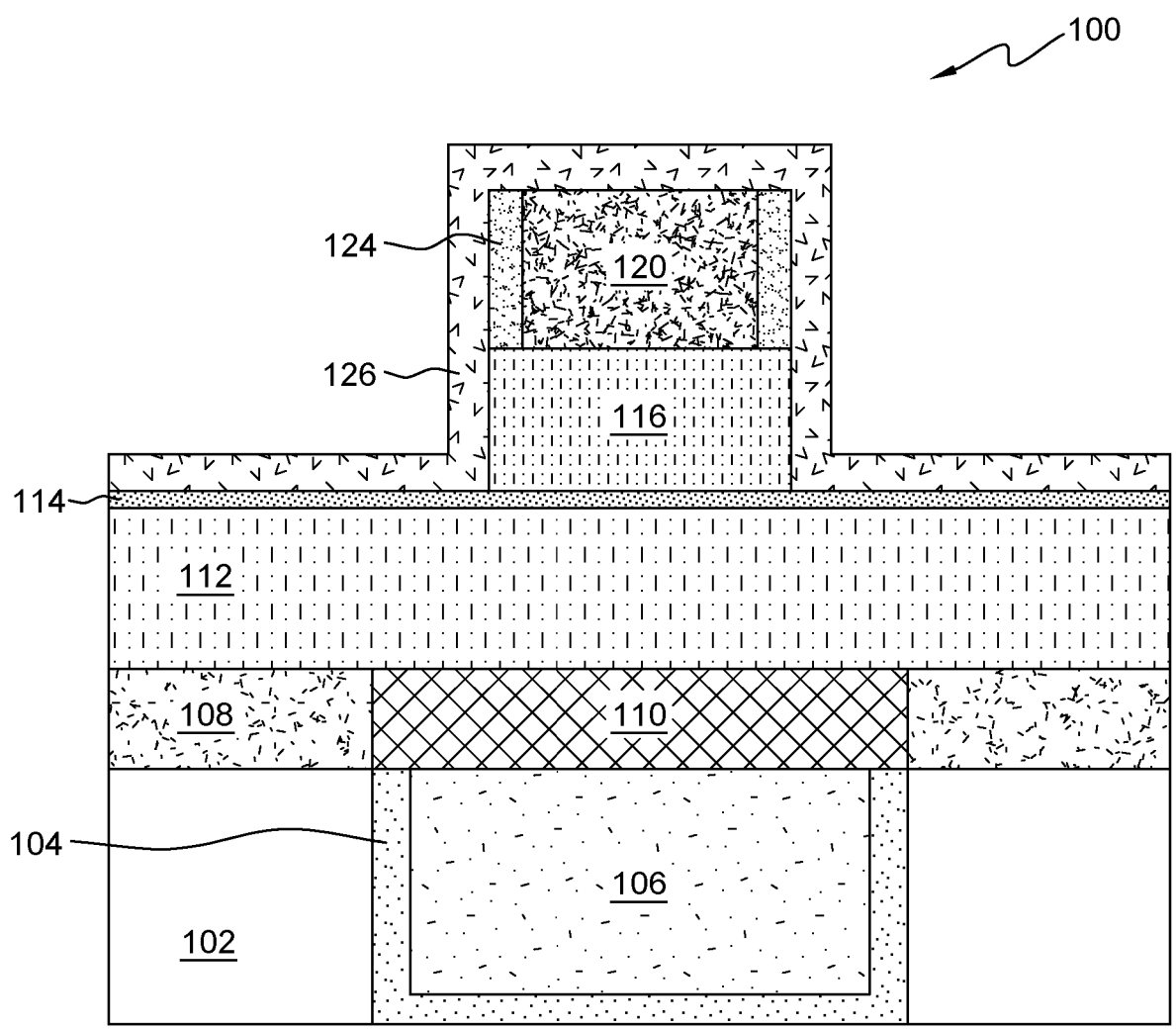
FIG. 4 is a cross section view illustrating a second encapsulation layer formed on top of the structure according to an exemplary embodiment.

Referring now to FIG. 4, the structure with a second encapsulation layer 126 is shown in accordance with an embodiment. The second encapsulation layer 126 is conformally deposited, using known deposition techniques, onto the top surface of the structure 100. The second encapsulation layer 126 may be made of the same material as the first encapsulation layer 122, such as, silicon nitride ($SiN_y$). However, the nitrogen concentration in the first encapsulation layer 122 is different ($N_x$) than the nitrogen concentration in the second encapsulation layer 126 ($N_y$) such that x>y. As a result, in an embodiment, the first encapsulation layer 122 may be made of a material that contains more nitrogen than the material used for the second encapsulation layer 126. In an alternative embodiment, the first encapsulation layer 122 may be made of a material that contains less nitrogen than the material used for the second encapsulation layer 126.

Figure 5:
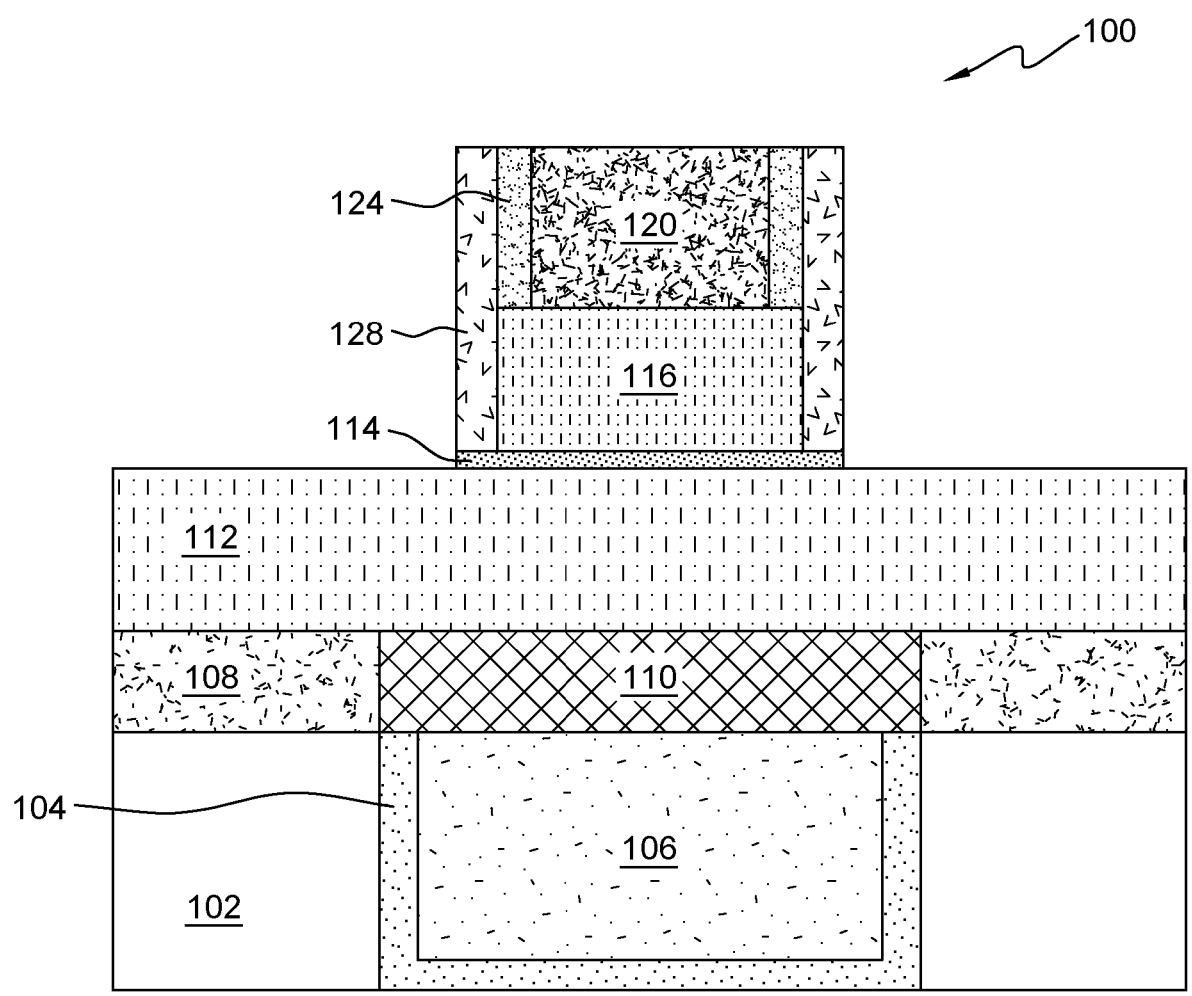
FIG. 5 is a cross section view illustrating a second encapsulation spacer formed at the sidewalls of a second magnetic layer according to an exemplary embodiment.

The structure 100 then undergoes an etch-back process to remove the horizontal portions of the second encapsulation layer 126 to form a second encapsulation spacer 128, illustrated in FIG. 5. The second encapsulation spacer 128 is formed at the sidewalls of the first encapsulation spacer 124 and the second magnetic layer 116, and vertically extends from the top surface of the hard mask cap 120 to a top surface of the tunnel layer 114. The structure 100 then undergoes a patterning process during which the tunnel layer 114 is patterned, exposing a top surface of the first magnetic layer 112. Portion of the tunnel layer 114 remains below the second magnetic layer 116 and the second encapsulation spacer 128 such that the sidewalls of the tunnel layer 114 are substantially flush with the sidewalls of the second encapsulation spacer 128.

During the patterning of the tunnel layer 114, the sidewalls of the second magnetic layer 112 are covered or surrounded by the second encapsulation spacer 128. The second encapsulation spacer 128 protects the second magnetic layer 112 from being damaged, by metal atom re-sputtering, during the patterning of the tunnel layer 114. As a result, the tunnel layer 114 gets patterned and the second magnetic layer 112 maintains its integrity and its well-defined interface with the second encapsulation spacer 128.

Figure 6:
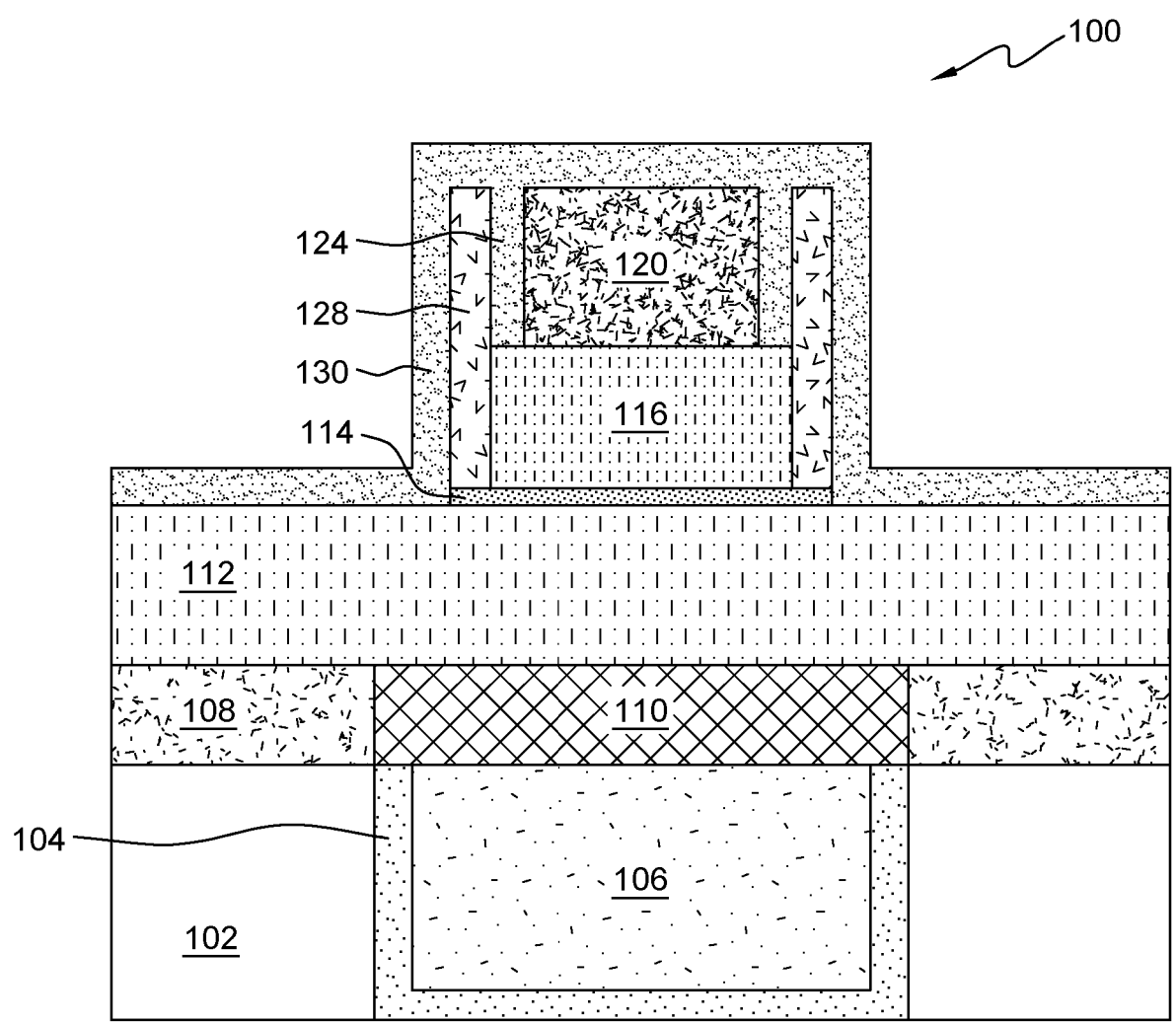
FIG. 6 is a cross section view illustrating a third encapsulation layer formed on top of the structure according to an exemplary embodiment.

Referring now to FIG. 6, the structure 100 with a third encapsulation layer 130 is shown, in accordance with an embodiment. The third encapsulation layer 130 is conformally deposited on top of the structure 100 using known deposition techniques such as, for example, ALD. The third encapsulation layer 130 may be made of silicon nitride ($SiN_x$), where the nitrogen concentration is substantially the same as the nitrogen concentration contained in the material used for the first encapsulation layer 122. As a result, nitrogen concentration contained within the third encapsulation layer 130 may be different than the nitrogen concentration contained in the second encapsulation layer 126.

After the third encapsulation layer 130 is deposited, the structure 100 undergoes an etch-back process and a patterning process. For example, a RIE process may be used to remove the horizontal portions of the third encapsulation layer 130 to form a third encapsulation spacer 132, illustrated in FIG. 7. The third encapsulation spacer 132 vertically extends from the top surface of the hard mask cap 120 to a top surface of the first magnetic layer 112. The third encapsulation spacer 132 covers the sidewalls of the tunnel layer 114.

Figure 7:
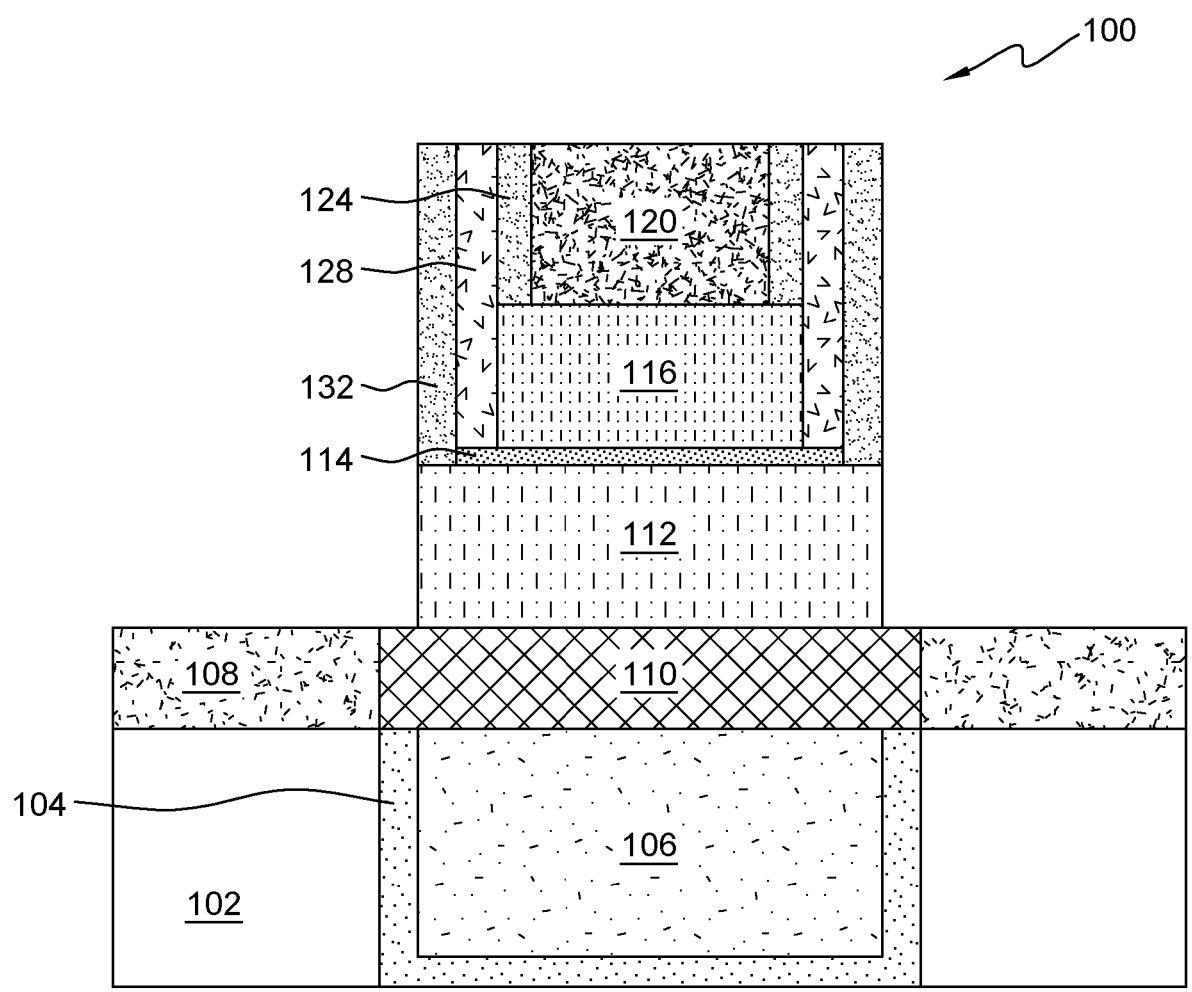
FIG. 7 is a cross section view illustrating a third encapsulation spacer formed at the sidewalls of a tunnel layer according to an exemplary embodiment.

With continued reference to FIG. 7, the structure 100 undergoes a patterning process during which the first magnetic layer 112 is patterned, exposing a top surface of the dielectric cap layer 108 and portions of a top surface of the bottom electrode 110. A portion of the first magnetic layer 112 remains directly below the tunnel layer 114 and the third encapsulation spacer 136 such that the sidewalls of the first magnetic layer 112 are substantially flush with the sidewalls of the third encapsulation spacer 132.

Since the third encapsulation spacer 132 vertically extends to the top surface of the first magnetic layer 112, the third encapsulation spacer 132 protects the sidewalls of the tunnel layer 114 during subsequent fabrication processes. As a result, during the patterning of the first magnetic layer 112, the metal atoms have no way of re-sputtering onto the sidewalls of the tunnel layer 114. As such, the tunnel layer 114 maintains its integrity and its well-defined interface with the third encapsulation spacer 132.

Figure 8:
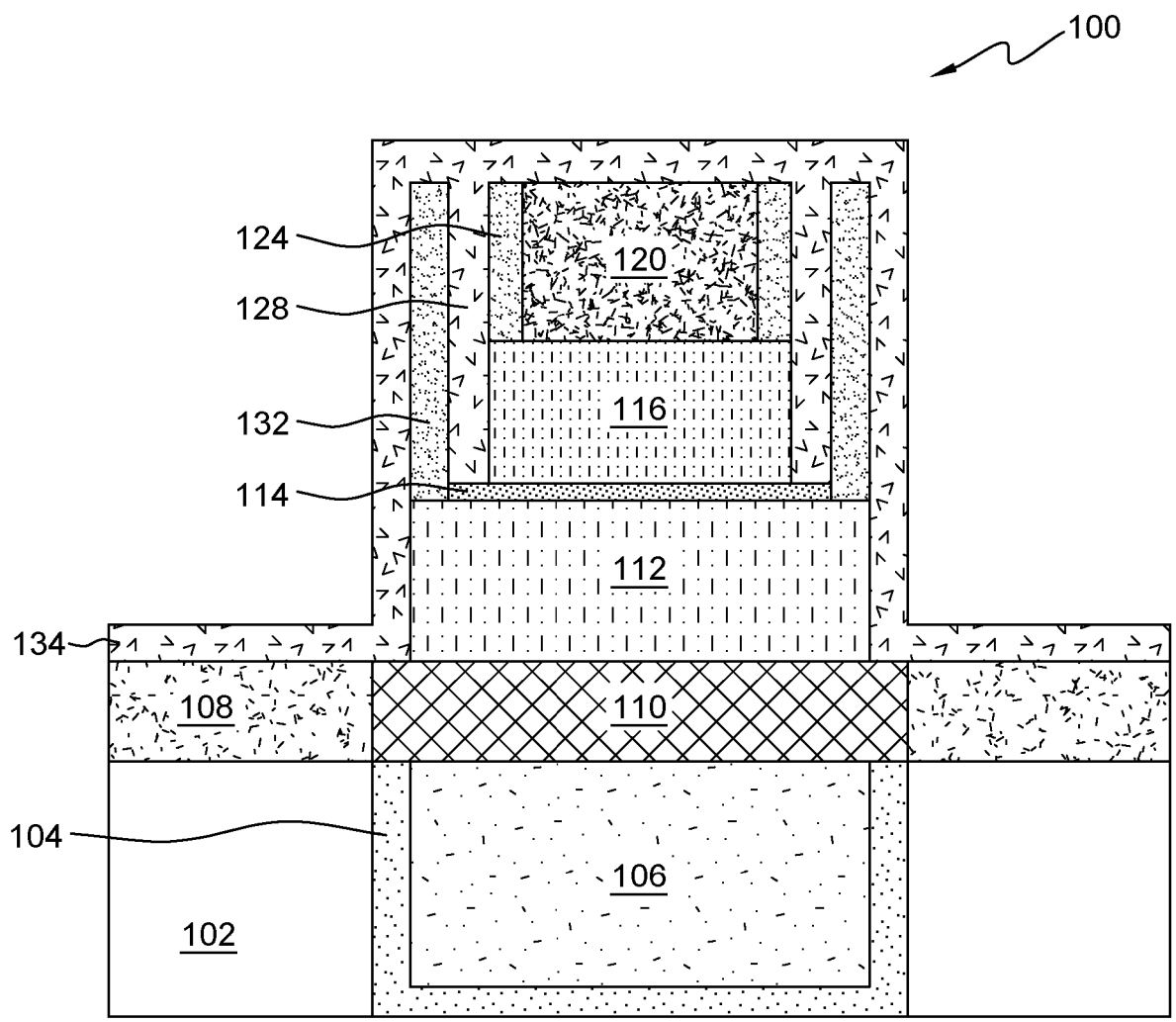
FIG. 8 is a cross section view illustrating a fourth encapsulation layer formed on top of the structure according to an exemplary embodiment.

Referring now to FIG. 8, the structure 100 with a fourth encapsulation layer 134 is shown, in accordance with an embodiment. The fourth encapsulation layer 134 is conformally deposited on top of the structure 100 using known deposition techniques such as, for example, ALD. The fourth encapsulation layer 134 may be made of silicon nitride ($SiN_y$), where the nitrogen concentration is substantially the same as the nitrogen concentration contained in the material used for the second encapsulation layer 126. As a result, nitrogen concentration contained within the fourth encapsulation layer 134 may be different than the nitrogen concentration contained in the third encapsulation layer 130. The nitrogen concentration contained within the fourth encapsulation layer 134 may also be different than the nitrogen concentration contained in the first encapsulation layer 122.

Figure 9:
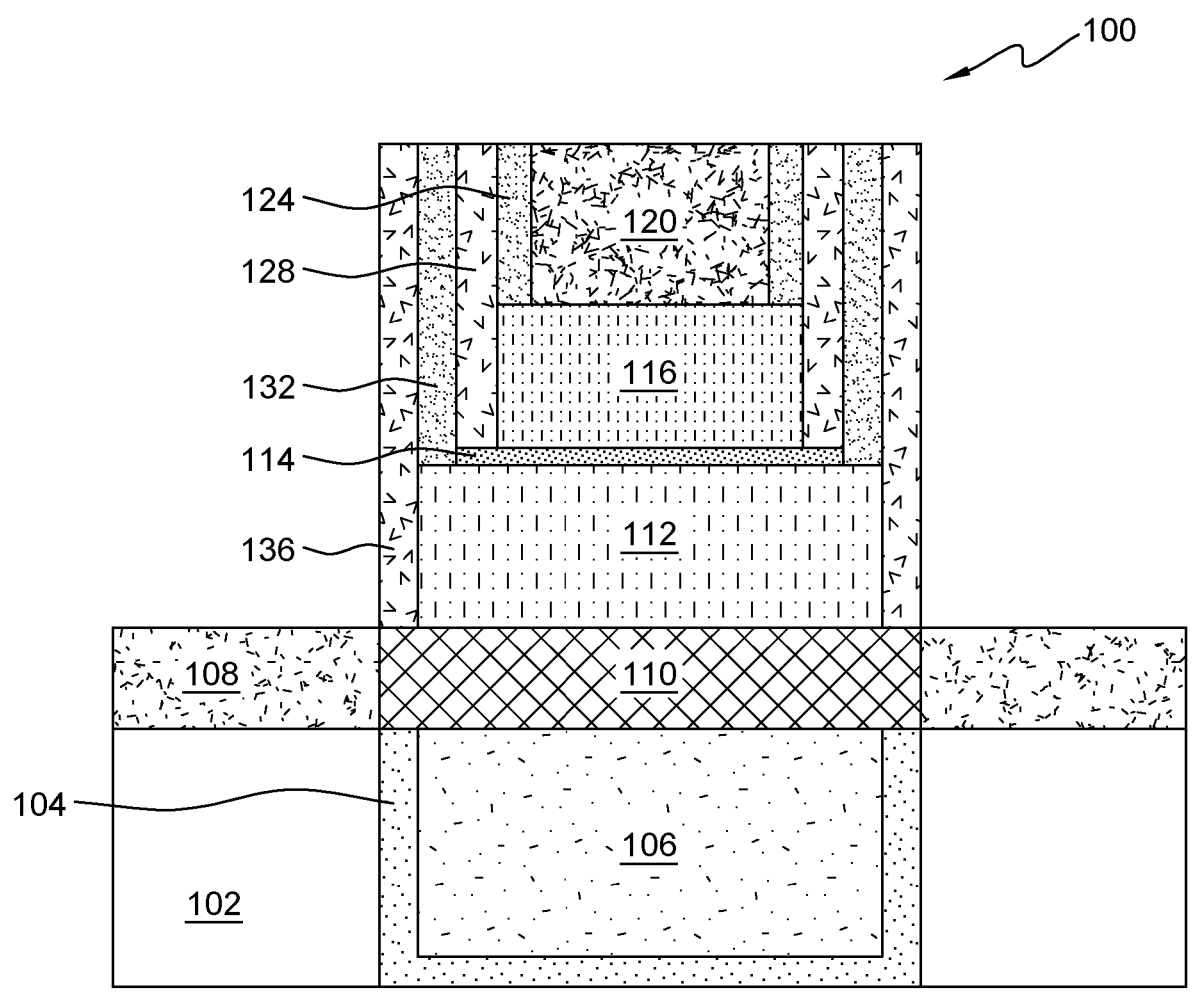
FIG. 9 is a cross section view illustrating a fourth encapsulation spacer formed at the sidewalls of a first magnetic layer according to an exemplary embodiment.

Referring now to FIG. 9, the structure 100 with a fourth encapsulation spacer 136 is shown, in accordance with an embodiment. After the fourth encapsulation layer 134 is conformally deposited on top of the structure 100, an etch-back process such as, for example, a RIE process, is performed to remove the horizontal portions of the fourth encapsulation layer 134 to form a fourth encapsulation spacer 136. The fourth encapsulation spacer 136 vertically extends from the top surface of the hard mask cap 120 to a top surface of the bottom electrode 110. The fourth encapsulation spacer 136 covers the sidewalls of the first magnetic layer 112.

Figure 10:
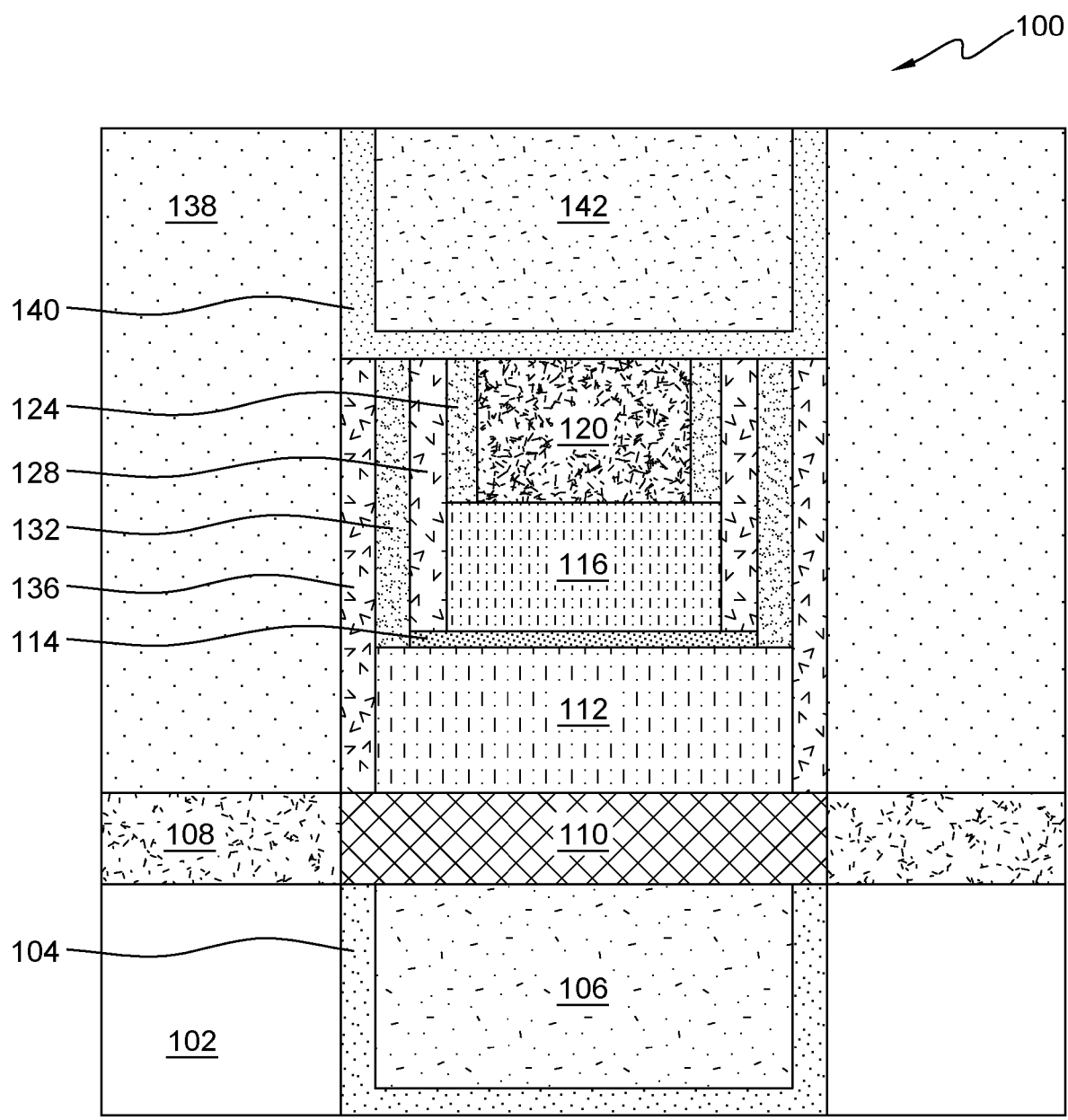
FIG. 10 is a cross section view illustrating a second interlayer dielectric (ILD), a second barrier layer, and a second metal interconnect according to an exemplary embodiment.

Referring now to FIG. 10, the structure 100 with a second interlayer dielectric (ILD) 138, a second barrier layer 140, and a second metal interconnect 142 is shown, in accordance with an embodiment. The second ILD 138 is deposited on the top surface of the structure 100, using known deposition techniques such as ALD. The second ILD 138 may be made of substantially the same material as the ILD 102. The second ILD 138 is then patterned and a metallization process is performed to form the second barrier layer 140 and the second metal interconnect 142.

The resultant structure 100, illustrated in FIG. 10, includes a pyramid shaped MTJ stack that includes the first magnetic layer 112, the tunnel layer 114, and the second magnetic layer 116. The first magnetic layer 112, situated directly above the bottom electrode 110, has a wider diameter compared to the tunnel layer 114 and the second magnetic layer 116. The tunnel layer 114, formed directly above the first magnetic layer 112, has a wider diameter compared to the second magnetic layer 116. The second magnetic layer 116, formed directly above the tunnel layer 114, has a wider diameter compared to the hard mask cap 120. The pyramid shaped MTJ stack is achieved by forming the one or more encapsulation spacers and patterning the MTJ stack in multiple steps.

In addition to the pyramid shaped MTJ stack, the resultant structure 100 also includes a plurality of encapsulation spacers that are positioned at the sidewalls of the MTJ stack and the hard mask cap 120. The first encapsulation spacer 124 is formed at the sidewalls of the hard mask cap 120 and vertically extends from the top surface of the second magnetic layer 116 to the top surface of the hard mask cap 120. The first encapsulation spacer 124 protects the sidewalls of the hard mask cap 120 from damage during the patterning of the second magnetic layer 116. The second encapsulation spacer 128 is formed at the sidewalls of the second magnetic layer 116 and vertically extends from the top surface of the tunnel layer 114 to the top surface of the hard mask cap 120. The second encapsulation spacer 128 is directly adjacent to the first encapsulation spacer 124. The second encapsulation spacer 128 protects the sidewalls of the second magnetic layer 116 during the patterning of the tunnel layer 114. As a result, there is no metal atom re-sputtering onto the sidewalls of the second magnetic layer 116. The third encapsulation spacer 132 is formed at the sidewalls of the tunnel layer 114 and vertically extends from the top surface of the first magnetic layer 112 to the top surface of the hard mask cap 120. The third encapsulation spacer 132 is directly adjacent to the second encapsulation spacer 128. The third encapsulation spacer 132 protects the sidewalls of the tunnel layer 114 from damage during the patterning of the first magnetic layer 112. As a result, there is no metal atom re-sputtering onto the sidewalls of the tunnel layer 114. The fourth encapsulation spacer 136 is formed at the sidewalls of the first magnetic layer 112 and vertically extends from the tops surface of the bottom electrode 110 to the top surface of the hard mask cap 120.

In an embodiment, the first, second, third, and fourth encapsulation spacers 124, 128, 132, 136, respectively, may be made of the same material such as, for example, of silicon nitride. However, the concentration of nitrogen in each of the spacers may differ. For example, first and the third encapsulation spacers 124, 132 may have the same nitrogen concentration, for example $N_x$, whereas the second and fourth encapsulation spacers 128, 136 may also have the same nitrogen concentration, for example $N_y$, where x>y. The nitrogen concentration may impact the microstructure of the silicon nitride material that makes up the first, second, third, and fourth encapsulation spacers 124, 128, 132, 136, respectively. That is, a lower nitrogen concentration may result in an amorphous silicon nitride microstructure which may provide improved barrier properties to oxygen diffusion. As a result, the first and second magnetic layers 112, 116 may be better protected from oxygen diffusion from the second ILD 138 when the second and fourth encapsulation spacers 128, 136 are made of silicon nitride with a lower nitrogen concentration that the nitrogen concentration in the first and third encapsulation spacers 124, 132.

In an alternative embodiment, the first, second, third, and fourth encapsulation spacers 124, 128, 132, 136, respectively, may be made of the same material such as, for example, of silicon nitride. In each of the spacers the concentration of nitrogen in the material used to form the spacers is the same. For example, the first, second, third, and fourth encapsulation spacers 124, 128, 132, 136, respectively, may be made of silicon nitride whose nitrogen concentration is $N_x$ or $N_y$.

In yet another embodiment, the first and second encapsulation spacers 124, 128 may be made of silicon nitride of different nitride concentrations, whereas the third and fourth encapsulation spacers 132, 136 may be made of different oxide materials. For example, the first encapsulation spacer 124 may be made of silicon nitride with nitrogen concentration $N_x$. The second encapsulation spacer 128 may be made of silicon nitride with nitrogen concentration $N_y$. The nitrogen concentration may be higher in the first encapsulation spacer 124 when compared to the nitrogen concentration in the second encapsulation spacer 128.

In addition, the third encapsulation spacer 132 may be made of aluminum oxide ($AlO_x$) and the fourth encapsulation spacer 136 may be made of silicon oxide ($SiO_x$). Having the third and fourth encapsulation spacers 132, 136 made of an oxide material may provide a better adhesion to the second ILD 138. However, having the first and the second encapsulation spacers 124, 128 made of an oxide material is not desirable because the oxygen from the oxide material may oxidize the sidewalls of the second magnetic layer 116 and the sidewalls of the tunnel layer 114. Oxidizing the sidewalls of the second magnetic layer 116 may modify or destroy the magnetic performance of the second magnetic layer 116, making the structure 100 unusable. Likewise, oxidizing the sidewalls of the tunnel layer 114 may impact its performance, rendering the MTJ stack unreliable.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a magnetic tunnel junction, the magnetic tunnel junction having a first magnetic layer and a second magnetic layer separated by a tunnel layer;
   a hard mask cap above the second magnetic layer, wherein a width of the hard mask cap is less than a width of the second magnetic layer;
   a first encapsulation spacer positioned along and directly contacting vertical sidewalls of the hard mask cap, wherein a top surface of the first encapsulation spacer is flush with a top surface of the hard mask cap;
   a second encapsulation spacer positioned along and directly contacting vertical sidewalls of the second magnetic layer, wherein a top surface of the second encapsulation spacer is flush with the top surface of the hard mask cap;
   a third encapsulation spacer positioned along vertical sidewalls of the tunnel layer, wherein a top surface of the third encapsulation spacer is flush with the top surface of the hard mask cap;
   a fourth encapsulation spacer positioned along vertical sidewalls of the first magnetic layer, wherein a top surface of the fourth encapsulation spacer is flush with the top surface of the hard mask cap;
   a first metal interconnect above the hard mask cap; and
   a barrier layer separating upper surfaces of each of the first encapsulation spacer, second encapsulation spacer, third encapsulation spacer, and fourth encapsulation spacer from the first metal interconnect.

2. The semiconductor structure of claim 1, further comprising:
   a second metal interconnect below and in electrical contact with the magnetic tunnel junction.

3. The semiconductor structure of claim 1, wherein the first magnetic layer has a wider diameter than the tunnel layer.

4. The semiconductor structure of claim 1, wherein the tunnel layer has a wider diameter than the second magnetic layer.

5. The semiconductor structure of claim 1, wherein the first encapsulation spacer and the second encapsulation spacer are made of silicon nitride of different nitrogen concentrations.

6. The semiconductor structure of claim 5, wherein the first encapsulation spacer has a higher concentration of nitrogen than the second encapsulation spacer.

7. The semiconductor structure of claim 1, wherein the third encapsulation spacer and the fourth encapsulation spacer are made of an oxide material.

8. The semiconductor structure of claim 1, wherein the first encapsulation spacer, the second encapsulation spacer, the third encapsulation spacer, and the fourth encapsulation spacer are made of same material.

9. A semiconductor structure comprising:
   a magnetic tunnel junction, comprising a first magnetic layer and a second magnetic layer separated by a tunnel layer;
   a hard mask cap on top and in electrical contact with the second magnetic layer;
   a first encapsulation spacer positioned along and directly contacting vertical sidewalls of the hard mask cap;
   a second encapsulation spacer positioned along and directly contacting vertical sidewalls of the second magnetic layer;
   a third encapsulation spacer positioned along vertical sidewalls of the tunnel layer;
   a fourth encapsulation spacer positioned along vertical sidewalls of the first magnetic layer;
   a first metal interconnect above the hard mask cap; and
   a barrier layer separating upper surfaces of each of the first encapsulation spacer, second encapsulation spacer, third encapsulation spacer, and fourth encapsulation spacer from the first metal interconnect.

10. The semiconductor structure of claim 9, further comprising:
a second metal interconnect below and in electrical contact with the magnetic tunnel junction.

11. The semiconductor structure of claim 9, wherein the first magnetic layer has a wider diameter than the tunnel layer.

12. The semiconductor structure of claim 9, wherein the tunnel layer has a wider diameter than the second magnetic layer.

13. The semiconductor structure of claim 9, wherein the first encapsulation spacer and the second encapsulation spacer are made of silicon nitride of different nitrogen concentrations.

14. The semiconductor structure of claim 13, wherein the first encapsulation spacer has a higher concentration of nitrogen than the second encapsulation spacer.

15. The semiconductor structure of claim 9, wherein the third encapsulation spacer and the fourth encapsulation spacer are made of an oxide material.

16. The semiconductor structure of claim 9, wherein the first encapsulation spacer, the second encapsulation spacer, the third encapsulation spacer, and the fourth encapsulation spacer are made of same material.

17. A method comprising:
forming a magnetic tunnel junction, the magnetic tunnel junction having a first magnetic layer and a second magnetic layer separated by a tunnel layer;
forming a hard mask cap on top and in electrical contact with the second magnetic layer;
forming a first encapsulation spacer positioned along and directly contacting vertical sidewalls of the hard mask cap;
forming a second encapsulation spacer positioned along and directly contacting vertical sidewalls of the second magnetic layer;
forming a third encapsulation spacer positioned along vertical sidewalls of the tunnel layer;
forming a fourth encapsulation spacer positioned along vertical sidewalls of the first magnetic layer;
forming a first metal interconnect above the hard mask cap; and
forming a barrier layer separating upper surfaces of each of the first encapsulation spacer, second encapsulation spacer, third encapsulation spacer, and fourth encapsulation spacer from the first metal interconnect.

18. The method of claim 17, further comprising:
forming a second metal interconnect below and in electrical contact with the magnetic tunnel junction.

19. The method of claim 17, wherein the first magnetic layer has a wider diameter than the tunnel layer.

20. The method of claim 17, wherein the tunnel layer has a wider diameter than the second magnetic layer.

21. The method of claim 17, wherein the first encapsulation spacer and the second encapsulation spacer are made of silicon nitride of different nitrogen concentrations.

22. The method of claim 21, wherein the first encapsulation spacer has a higher concentration of nitrogen than the second encapsulation spacer.

23. The method of claim 17, wherein the third encapsulation spacer and the fourth encapsulation spacer are made of an oxide material.

24. The method of claim 17, wherein the first encapsulation spacer, the second encapsulation spacer, the third encapsulation spacer, and the fourth encapsulation spacer are made of same material.

* * * * *